US006770896B2

(12) United States Patent
Schriever

(10) Patent No.: US 6,770,896 B2
(45) Date of Patent: Aug. 3, 2004

(54) METHOD FOR GENERATING EXTREME ULTRAVIOLET RADIATION BASED ON A RADIATION-EMITTING PLASMA

(75) Inventor: Guido Schriever, Goettingen (DE)

(73) Assignee: Xtreme technologies GmbH, Jena (DE)

(*) Notice: Subject to any disclaimer, the term of this patent is extended or adjusted under 35 U.S.C. 154(b) by 0 days.

(21) Appl. No.: 10/357,173

(22) Filed: Feb. 3, 2003

(65) Prior Publication Data

US 2003/0146398 A1 Aug. 7, 2003

(30) Foreign Application Priority Data

Feb. 6, 2002 (DE) .......................................... 102 05 189

(51) Int. Cl.$^7$ .............................................. H05H 1/04
(52) U.S. Cl. .................................................. 250/504 R
(58) Field of Search ..................................... 250/504 R

(56) References Cited

U.S. PATENT DOCUMENTS 3,911,318 A * 10/1975 Spero et al. ................... 315/39
6,180,952 B1 * 1/2001 Haas et al. ............... 250/492.2
6,507,641 B1 * 1/2003 Sugisaki et al. ............ 378/119

OTHER PUBLICATIONS

G. Schriever, K. Bergmann, R. Lebert, "Extreme ultravioler emission of laser–produced plasmas using a cryogenic xenon target", *J. Vac. Sci. Technol.* B 17 (5) (1999), 2058–2060.*

J. Blackburn, P. K. Carroll, J. Costello, G. O'Sullivan, "Spectra of Xe VII, VIII, and IX in the extreme ultraviolet: 4d–mp, nf transitions", *J. Opt. Soc. Am.* 73, No. 10 (1983) 1325–1329.*

W. T. Silfvast et al., "Laser–produced plasmas for soft x–ray projection lithography", *J. Vac. Sci. Technol.* B 10 (6) (1992), 3126–3133.*

* cited by examiner

*Primary Examiner*—John R. Lee
*Assistant Examiner*—Phillip A Johnston
(74) *Attorney, Agent, or Firm*—Reed Smith LLP

(57) ABSTRACT

The invention is directed to a method for generating extreme ultraviolet (EUV) radiation based on a radiation-emitting plasma, particularly for generating EUV radiation with a wavelength around 13 nm. The object of the invention, to find a novel possibility for generating extreme ultraviolet radiation based on a radiation-emitting plasma in which the emission output of the EUV source is increased to the wavelength range above the L-absorption edge of silicon without substantially increasing the technical and monetary expenditure for plasma generation, is met in a method for generating extreme ultraviolet radiation through emission of broadband radiation from a plasma under vacuum conditions in that the plasma is generated using at least one element from V to VII in the p-block of the fifth period of the periodic table of elements. Iodine, tellurium, antimony or materials containing these elements or chemical compounds formed with these elements are preferably used. The invention is advantageously applied in EUV lithography for semiconductor chip fabrication.

20 Claims, 1 Drawing Sheet

METHOD FOR GENERATING EXTREME ULTRAVIOLET RADIATION BASED ON A RADIATION-EMITTING PLASMA

CROSS-REFERENCE TO RELATED APPLICATIONS

This application claims priority of German Application No. 102 05 189.5, filed Feb. 6, 2002, the complete disclosure of which is hereby incorporated by reference.

BACKGROUND OF THE INVENTION a) Field of the Invention

The invention is directed to a method for generating extreme ultraviolet (EUV) radiation based on a radiation-emitting plasma, particularly for generating EUV radiation with a wavelength around 13 nm. It is preferably applied in EUV lithography for semiconductor chip fabrication.

b) Description of the Prior Art

Increasingly smaller structures in semiconductor technology are testing the physical boundaries of currently available exposure methods for producing semiconductor structures. This is caused by the structures on the order of magnitude of the wavelength of the light used for the lithography methods that are employed. Smaller structure sizes accordingly require the use of light of increasingly smaller wavelength. Therefore, EUV lithography is one of the most promising developments for future lithography methods.

Beam guiding and beam shaping in EUV radiation are made possible by multilayer mirrors. Reflection optics (multilayer mirror optics) by which EUV radiation can be bundled and guided can be realized by means of these multilayer mirrors. Reflection optics of this type which usually contain molybdenum and silicon have their greatest reflectivity (about 70%) in a wavelength range which can be adjusted depending on the thickness of the applied layers and depending on the angle of incidence of the radiation, but which should always be on the long-wave side of the L-absorption edge (12.4 nm) of silicon, since silicon absorbs only slightly in this case.

Currently known EUV sources usually work with xenon. With laser-induced plasmas, the laser radiation is focused on xenon at high intensities, whereas, with gas-discharge sources, xenon is used in the discharge chamber as a work gas either in a mixture with another gas or in pure form. Xenon, which is gaseous under normal conditions, can be used without further processing in gas-discharge sources but is less suited as a target material for laser-induced plasmas because of its low density. The condensation of xenon that is attempted for this reason poses a technological challenge because the temperature range of the melting phase is very small (about −108° C. to −111° C.) and consequently an elaborate cooling installation with very good temperature regulation is required for handling xenon. Further, xenon has the disadvantage of very high cost (about 10 euros per liter of gas), which represents an added disadvantage to its use as a liquid (with correspondingly high consumption).

The spectral distribution of the light emission of xenon (ionization factor of 8 to 12, 4d–4f transitions) typically exhibits a maximum in the wavelength range between 10.5 nm and 11.0 nm, that is, on the short-wave side of the silicon line. The position of the maximum can be shifted slightly by varying the plasma parameters of density and temperature, but only by a few tenths of a nanometer ($10^{-10}$ m) in practice, as is described by G. Schriever et al. (G. Schriever, K. Bergmann, R. Lebert, "Extreme ultraviolet emission of laser-produced plasmas using a cryogenic xenon target", *J. Vac. Sci. Technol.* B 17 (5) (1999), 2058–2060). This means that the emission characteristic of xenon is relatively poorly adapted to the reflection characteristic of the multilayer mirrors described above and large proportions of radiation are accordingly absorbed within the silicon layers of the optics.

The emission characteristic of xenon has already been investigated for many years in gas discharge sources because it is easily managed as a gaseous material. This led to auxiliary theoretical observations in which the emission is described by Hartree-Fock calculations (e.g., J. Blackburn, P. K. Carroll, J. Costello, G. O'Sullivan, "Spectra of Xe VII, VIII, and IX in the extreme ultraviolet: 4d-mp, nf transitions", *J. Opt. Soc. Am.* 73, No. 10 (1983) 1325–1329). The extensive investigations in the past with experimental and theoretical results have made xenon a universal and very well-known target material for EUV sources. The radiation outputs achieved for the investigated applications were sufficient for these applications, but are too low for EUV lithography in connection with beam-shaping optics.

It is known from another publication by W. T. Silfvast et al. ("Laser-produced plasmas for soft x-ray projection lithography", *J. Vac. Sci. Technol.* B 10 (6) (1992), 3126–3133) that tin is a broadband emitter in the wavelength range between 13.0 nm and 13.5 nm. In this connection, tin was used as a solid target for laser-induced plasmas. The greatest disadvantage of tin is its extensive debris emission. It is particularly disadvantageous that this material can be removed from contaminated surfaces only with difficulty due to the high boiling temperatures of tin (approximately 2602° C.).

OBJECT AND SUMMARY OF THE INVENTION

It is the primary object of the invention to find a novel possibility for generating extreme ultraviolet radiation based on a radiation-emitting plasma in which the emission output of the EUV source is increased to the wavelength range above the L-absorption edge of silicon without substantially increasing the technical and monetary expenditure for plasma generation.

According to the invention, this object is met in a method for generating broadband extreme ultraviolet radiation through emission of radiation from plasma under vacuum conditions in that the plasma is generated using at least one element from V to VII in the p-block of the fifth period of the periodic table of elements.

The plasma is advantageously generated with the participation of iodine or iodine compounds.

Further, the plasma is advisably generated with the participation of tellurium or tellurium compounds or with the use of antimony or antimony compounds.

The plasma can advantageously be generated with the participation of chemical compounds of iodine with tellurium or antimony, particularly tellurium-iodide and antimony-iodide.

In order to achieve a particularly intensive radiation yield of about 13 nm, it has proven advantageous to generate the plasma from chemical compounds of iodine with lithium or fluorine, particularly LiI and $IF_7$ or $IF_5$. This results in the superposition of the broadband iodine emission and line emissions of lithium and fluorine.

The suggested materials for plasma generation are advantageously suitable for gas discharge-based EUV sources in that they are evaporated and introduced into the evacuated discharge chamber as work gas.

On the other hand, the materials for plasma generation are equally advantageously suited to laser-based EUV sources in that they are introduced as target material for the excitation radiation by means of laser radiation. The material can be introduced as liquid target material as well as in a solid aggregate state.

The invention is based on the idea that xenon, the material that is usually used for generating EUV radiation, does not actually have the optimal radiation characteristic for the multilayer reflection optics made of molybdenum and silicon that are currently available for transmission of EUV radiation because the reflectivity of the optics below the L-absorption edge of silicon (about 12.4 nm) is considerably limited. The large quantity of optical systems in a lithography stepper or lithography scanner (approximately 10 in a series-produced device) results in excessive radiation loss. In addition, particularly for laser-induced plasma, the cost of condensing xenon when used as target material, together with the price of xenon which is already high by itself, represents a substantial cost factor.

On the other hand, tests with metallic target material comprising tin which are known in laser-induced plasma generation are unsuitable for long-lasting EUV sources because of excessive debris and the resulting limitations.

Surprisingly, however, it has been shown that the elements iodine, tellurium or antimony (and chemical compounds thereof) which were discovered because of their electronic similarity to xenon have considerably better characteristics than tin with respect to debris. While the debris is not negligible, it is much easier to remove due to much lower melting points and boiling points in that the contamination of surfaces is eliminated by evaporation at permissible heating temperatures. In addition, the low boiling points also facilitate use in gas discharge sources for generating EUV.

The lower atomic numbers of the suggested elements compared to xenon result in an emission of photons with less photon energy and a greater wavelength, with all other electronic preconditions (ionization coefficient) and intraion transitions remaining the same. Therefore, the elements are better suited than xenon for the emission of radiation at a wavelength of around 13 nm.

The method according to the invention makes it possible to generate EUV radiation based on a radiation-emitting plasma in which the emission output of the EUV source in the wavelength range is increased above the L-absorption edge of silicon without a substantial increase in technical and monetary expenditure compared to plasma generation by means of xenon. In particular, the method achieves a better matching of the emission of an EUV source to multilayer reflection optics comprising molybdenum and silicon. Further, the invention substantially reduces the cost of material for plasma generation compared to xenon.

The invention will be described more fully in the following with reference to embodiment

DESCRIPTION OF THE PREFERRED EMBODIMENTS

Figure 1:
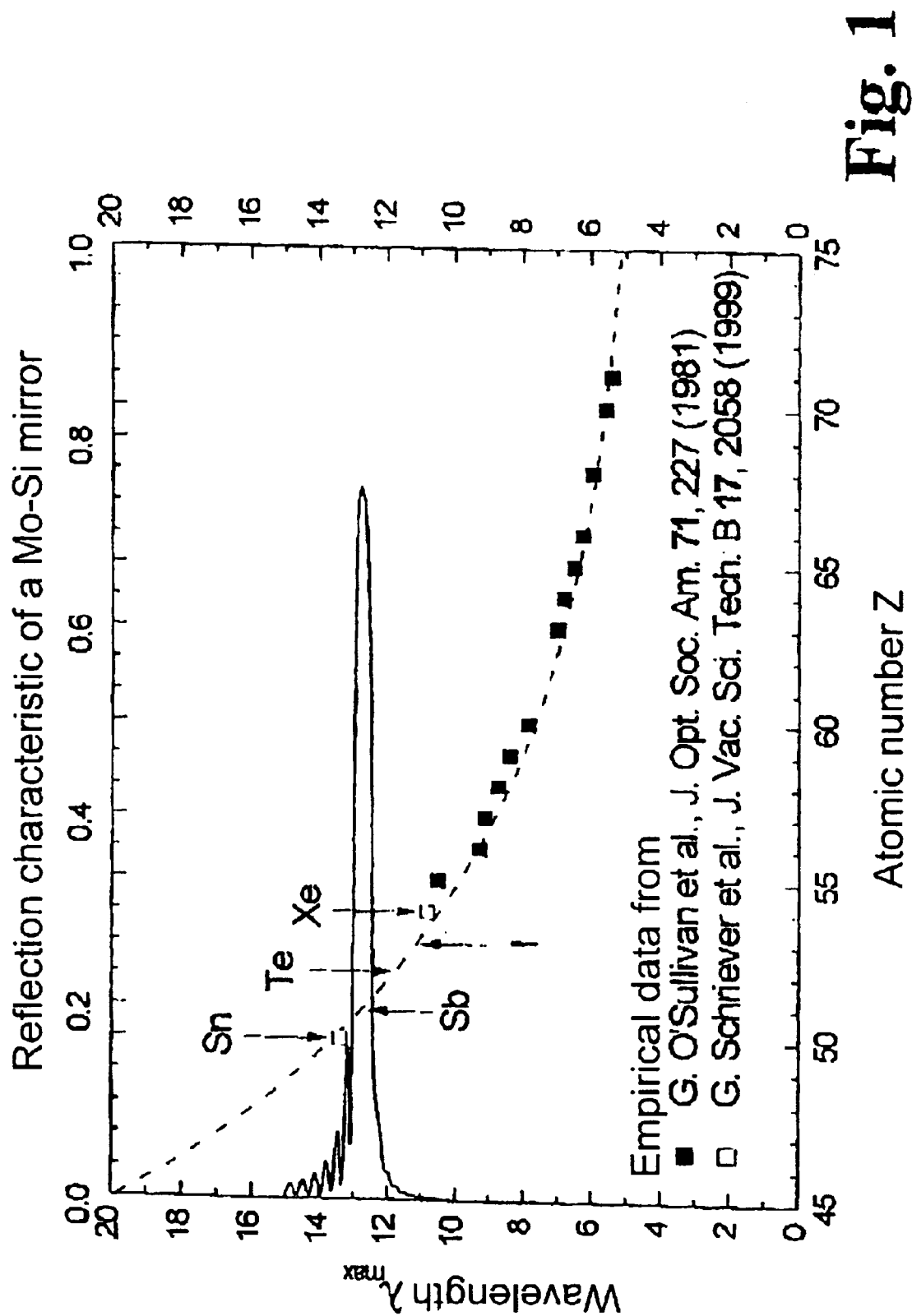
FIG. 1 shows the maximum wavelength of the emission spectrum as a function of the atomic number of the emitting element compared with the reflection characteristic of molybdenum-silicon multilayer reflection optics.

Due to the choice of new materials for plasma generation, the method according to the invention which emits EUV radiation from a hot plasma is suitable in a surprisingly simple manner for laser-based EUV sources as well as for EUV sources based on gas discharge. The materials used for this purpose contain at least one element from V to VII in the p-block of the fifth period of the periodic table of elements or chemical compounds formed therefrom.

The new method for generation of EUV radiation is based on the following observations:

The output of an EUV radiation source coupled out by reflection optics can be given by $$P = \int I(\lambda) R(\lambda) d\lambda,$$

where I is the intensity radiated from the plasma of the radiation source and R is the reflectivity of the optics as a function of wavelength $\lambda$.

This reflected output, which is integrated over the entire reflection characteristic of the optics, is greater when the maxima of the reflection characteristic of the optics and of the emission characteristic of the radiator lie close together or when both characteristics have substantial overlaps.

FIRST EXAMPLE

In the periodic table of elements, iodine has an atomic number of Z=53, tellurium has an atomic number Z=52, and antimony has an atomic number of Z=51. These elements have a lower atomic number than xenon. Based on these lower atomic numbers, it was supposed, given a similarity of electronic transitions compared to xenon (same period in the periodic table), that the maximum of the emission characteristic shifts toward greater wavelengths compared to xenon. However, this expectation conflicted with the known behavior of tin (which had already been investigated extensively as a target for laser-based generation of EUV radiation and had extremely high debris emission), so that the use of nonhalogens was not assumed to be advantageous for long-lasting EUV sources.

The emission of debris in iodine is surprisingly low compared to tin. This could be due to its high vapor pressure combined with a fast evaporation in the vacuum environment that is necessary for the propagation of EUV radiation.

Because of its relatively low boiling point of 114° C. and vaporization point of 184°, iodine can be handled relatively easily in all solid states. Accordingly, only moderate heating above the boiling point is required to use iodine as a work gas in gas discharge sources for generation of EUV radiation. It is also important that iodine is distinctly cheaper than xenon.

The elements tellurium and antimony are metals which are used as solid target material for laser-induced plasma in the simplest case. With these two elements—in a manner similar to iodine—the emission characteristic compared to xenon is shifted further to greater wavelengths, i.e., to a substantial extent in a wavelength range between 12.0 nm and 13.0 nm.

This is illustrated in FIG. 1 in which the radiation characteristics of the EUV emission are plotted as a function of wavelength $\lambda_{max}$ over the atomic number Z of empirically investigated elements. The results which are already published prior art are indicated as white or black squares, depending on the literature source, and the new target materials according to the invention in the form of the (unbound) elements iodine, tellurium and antimony are indicated by arrows. For the sake of comparison, the drawing also shows the reflection characteristic of the currently available Mo—Si multilayer mirrors as evidence of the success of the invention in matching radiation characteristics to the reflectivity of these mirrors. It is important to note that while the maxima of the EUV emission in iodine and tellurium are still below the Si-absorption edge, the emission characteristic in both cases has such a broad band that a substantial proportion of the emitted radiation can be transmitted by the multilayer optics, and a bundling and beam-shaping of sufficiently intensive EUV radiation is made possible.

The relatively low melting points of about 450° C. (tellurium) and 630° C. (antimony) also make it possible to use tellurium and antimony as liquids without substantial difficulties. Further, the relatively low boiling points of 988° C. (tellurium) and 1587° C. (antimony) (compared to the boiling point of tin at 2602° C.) make it possible to clean contaminated surfaces in a simple manner by evaporation of the deposited material through permissible heating of these surfaces. This simple cleaning procedure increases the life of an EUV source designed in this manner.

Due to the low boiling points of tellurium and antimony, both elements can also be used successfully in gas discharge-based EUV sources.

SECOND EXAMPLE

Due to the physical characteristics of tellurium and antimony, numerous chemical compounds containing tellurium or antimony can be resorted to for application in gas discharge sources. Therefore, additional chemical compounds containing iodine, tellurium or antimony are suggested as target materials. Gaseous $IF_7$ or $IF_5$ will emit additionally intensive emission lines of fluorine at 12.8 nm, while solid lithium-iodide (LiI) produces an additional emission line of lithium at a wavelength of 13.5 nm.

Further, compounds of the elements of the fifth period of the periodic table of elements suggested in the first example are suitable for the described purposes, e.g., tellurium-iodide or antimony-iodide.

Besides an increased emission characteristic in the longer-wave EUW range (above 12.4 nm) which is better adapted to currently available mirror optics—in accordance with the reflection characteristic shown in addition in FIG. 1—a considerable cost savings is achieved by the above-mentioned chemical compounds compared to the use of xenon.

Therefore, higher-power, long-lasting EUV sources which are advantageous with respect to currently common xenon sources, also as regards cost considerations, are available for the next generation of lithography machines in semiconductor fabrication.

While the foregoing description and drawings represent the present invention, it will be obvious to those skilled in the art that various changes may be made therein without departing from the true spirit and scope of the present invention.

What is claimed is:

1. In a method for generating extreme ultraviolet radiation through emission of broadband radiation from a plasma under vacuum conditions, the method comprising the step of:

generating the plasma using materials with the participation of at least one element or compound thereof from V to VII in the p-block of the fifth period of the periodic table of elements, and;

emitting from said plasma, intensive extreme ultraviolet light (EUV) above the L-absorption edge of silicon at wavelengths of about 13 nm as part of an emitted extreme ultraviolet light (EUV) spectra.

2. The method according to claim 1, wherein the plasma is generated with the participation of iodine in solid form or chemical compounds in solid form formed with iodine.

3. The method according to claim 1, wherein the plasma is generated with the participation of tellurium or chemical compounds formed with tellurium.

4. The method according to claim 1, wherein the plasma is generated with the participation of antimony or chemical compounds formed with antimony.

5. The method according to claim 1, wherein the plasma is generated using chemical compounds of iodine, tellurium and antimony with one another.

6. The method according to claim 1, wherein the plasma is generated using chemical compounds of iodine with lithium.

7. The method according to claim 1, wherein the plasma is generated using chemical compounds of iodine and fluorine.

8. The method according to claim 1, wherein the material for plasma generation is evaporated and introduced as a work gas in a gas discharge-based EUV source.

9. The method according to claim 1, wherein the material for plasma generation is introduced in a laser-based EUV source as target material for excitation radiation by means of laser radiation.

10. The method according to claim 9, wherein the material is introduced as liquid target material.

11. The method according to claim 9, wherein the material is introduced as solid target material.

12. The method according to claim 5 wherein the compounds are tellurium-iodide or antimony-iodide.

13. The method according to claim 7, wherein the plasma is generated using $IF_7$ or $IF_5$.

14. The method according to claim 6, wherein the plasma is generated using lithium-iodide (LiI).

15. A method for generating extreme ultraviolet radiation (EUV) through emission of broadband radiation from a plasma under vacuum conditions, the method comprising the step of:

generating the plasma using materials with the participation of at least one element or compound thereof from V to VII in the p-block of the fifth period of the periodic table of elements, and;

emitting from said plasma, intensive extreme ultraviolet light (EUV) at wavelengths of about 11–14 nm.

16. A method for generating extreme ultraviolet radiation (EUV) through emission of broadband radiation from a plasma under vacuum conditions while reducing the harmful effects of debris generated in the process, the method comprising the step of:

generating the plasma using materials with the participation of at least one element or compound thereof from V to VII in the p-block of the fifth period of the periodic table of elements; emitting from said plasma, extreme ultraviolet light (EUV) at wavelengths of about 11–14 nm; and reflecting said extreme ultraviolet light (EUV) on reflective optics wherein any debris produced by said materials during said emitting from said plasma, and that is transferred to said reflective optics, is removed by heating said reflective optics above a boiling point of at least one element or compound thereof from V to VII in the p-block of the fifth period of the periodic table of elements to remove said debris thereby improving said reflecting.

17. The method of claim 16 wherein the element or compound thereof from V to VII in the p-block of the fifth period of the periodic table of elements is:

Tellurium or a compound formed with Tellurium.

18. The method of claim 16 wherein the element or compound thereof from V to VII in the p-block of the fifth period of the periodic table of elements is:

Antimony or a compound formed with Antimony.

19. The method of claim 16 wherein the material is Iodine in a solid state or solid state compounds thereof.

20. The method claim 16 wherein said reflective optics is at least one Molybdenum-Silicon (Mo—Si) mirror.

* * * * *